United States Patent
Lu

(10) Patent No.: US 7,242,234 B1
(45) Date of Patent: Jul. 10, 2007

(54) EDGE-TRIGGERED FLIP-FLOP

(75) Inventor: Wei-Ping Lu, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/851,048

(22) Filed: May 21, 2004

Related U.S. Application Data

(60) Provisional application No. 60/533,887, filed on Jan. 2, 2004.

(51) Int. Cl.
*H03K 3/00* (2006.01)
*H03K 19/096* (2006.01)

(52) U.S. Cl. .......................................... 327/199; 326/98
(58) Field of Classification Search ................. 327/55, 327/57, 199–201, 208, 210–212, 214–219, 327/223, 225, 112, 203, 206; 326/85, 87, 326/98; 365/203–207
See application file for complete search history.

(56) References Cited

U.S. PATENT DOCUMENTS 6,070,259 A * 5/2000 Roisen et al. ............... 714/726
6,388,471 B1 5/2002 Lu et al. ....................... 326/98

* cited by examiner

*Primary Examiner*—My-Trang Nuton

(57) ABSTRACT

An edge-triggered flip-flop is provided that includes one or more storage nodes and a pre-charge circuit in communication with the storage circuit. The storage circuit is configured to pre-charge the one or more storage nodes to a pre-determined voltage potential. The storage circuit further includes a first pull-down logic circuit in communication with the storage circuit and separate second pull-down logic circuit in communication with the storage circuit. The first pull-down logic circuit is configured to discharge one or more of the pre-charged storage nodes in response to first input data and the second pull-down logic circuit is configured to discharge one or more of the pre-charged storage nodes in response to second input data.

47 Claims, 5 Drawing Sheets

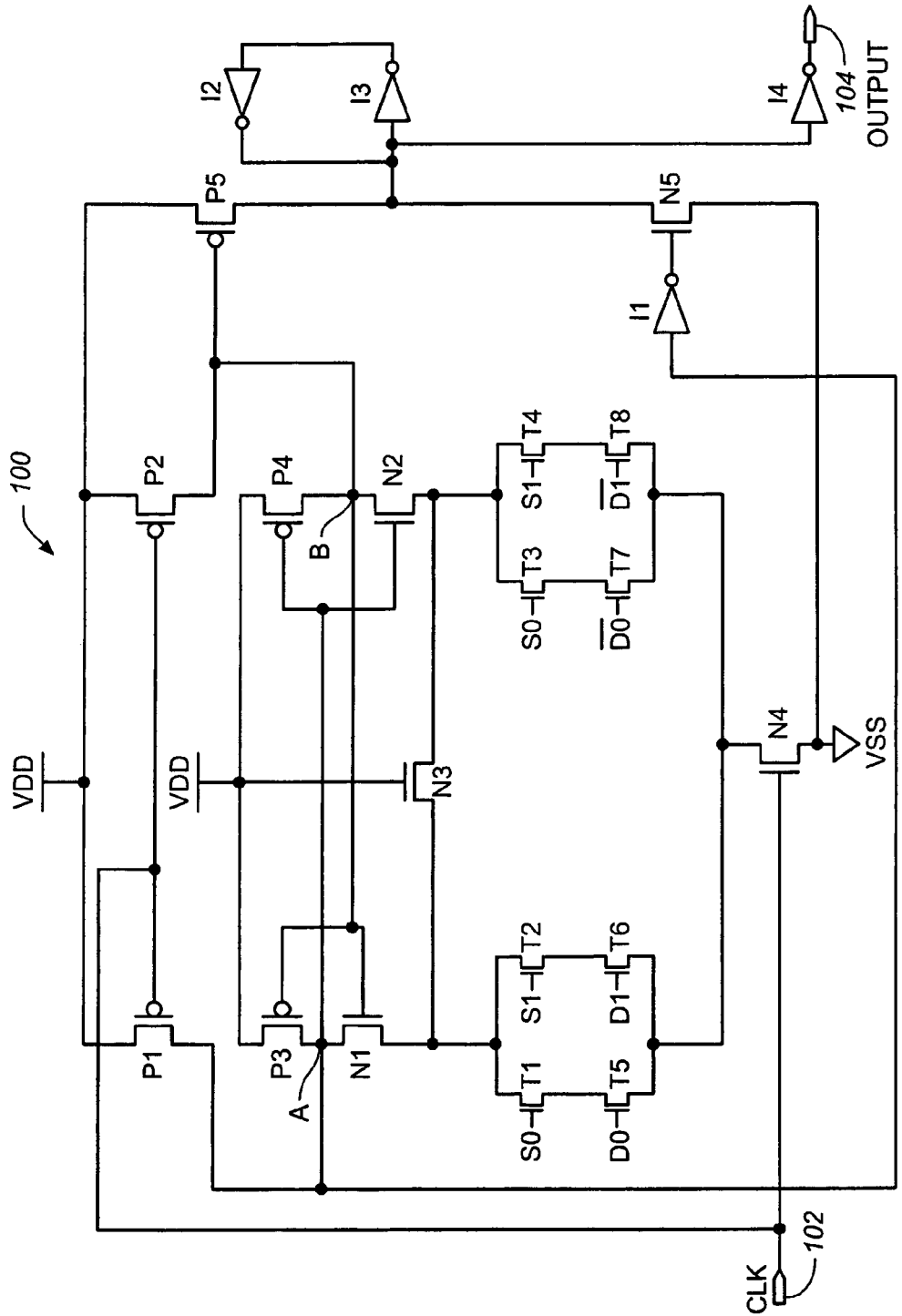
FIG._1 *(PRIOR ART)*

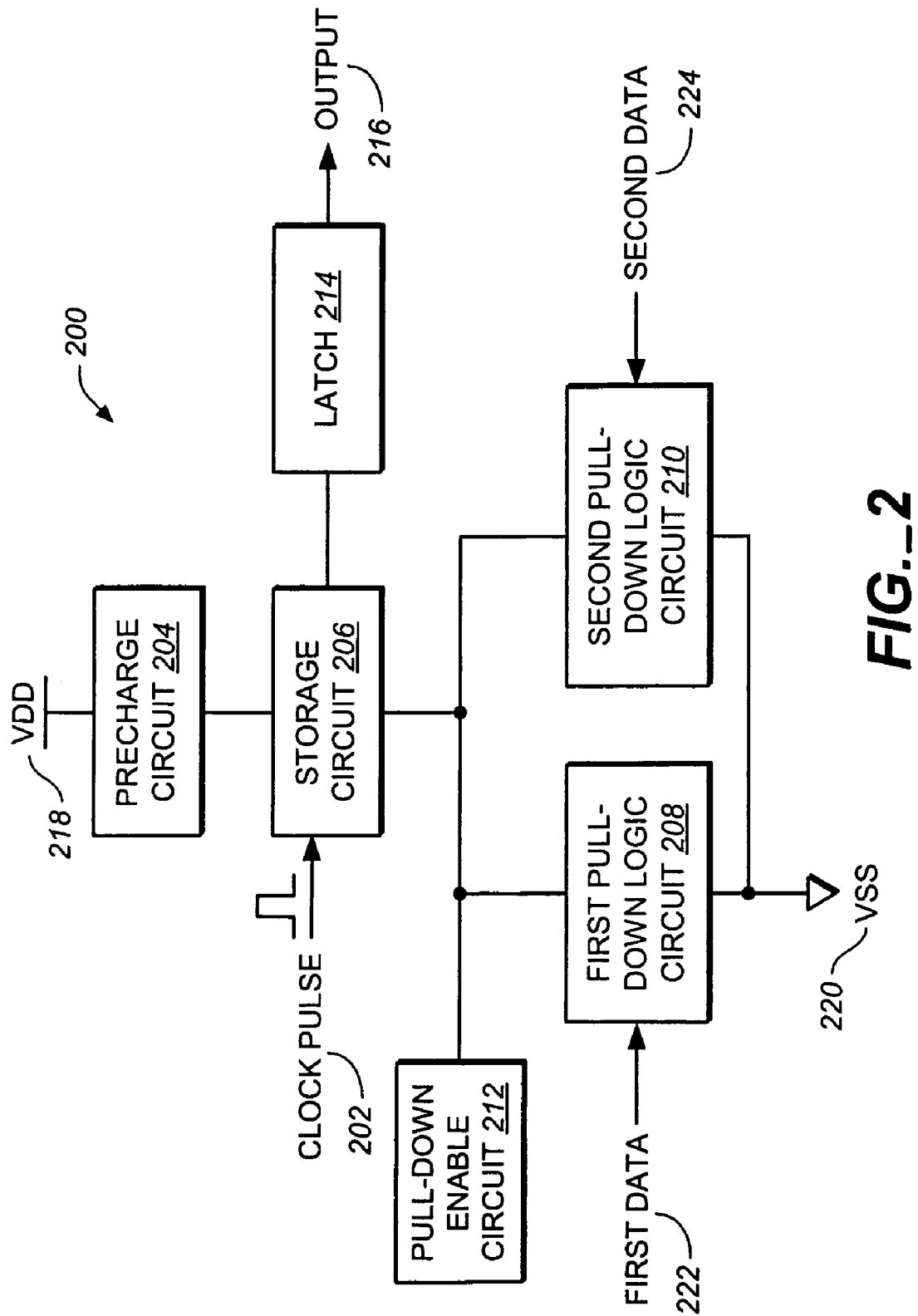
FIG._2

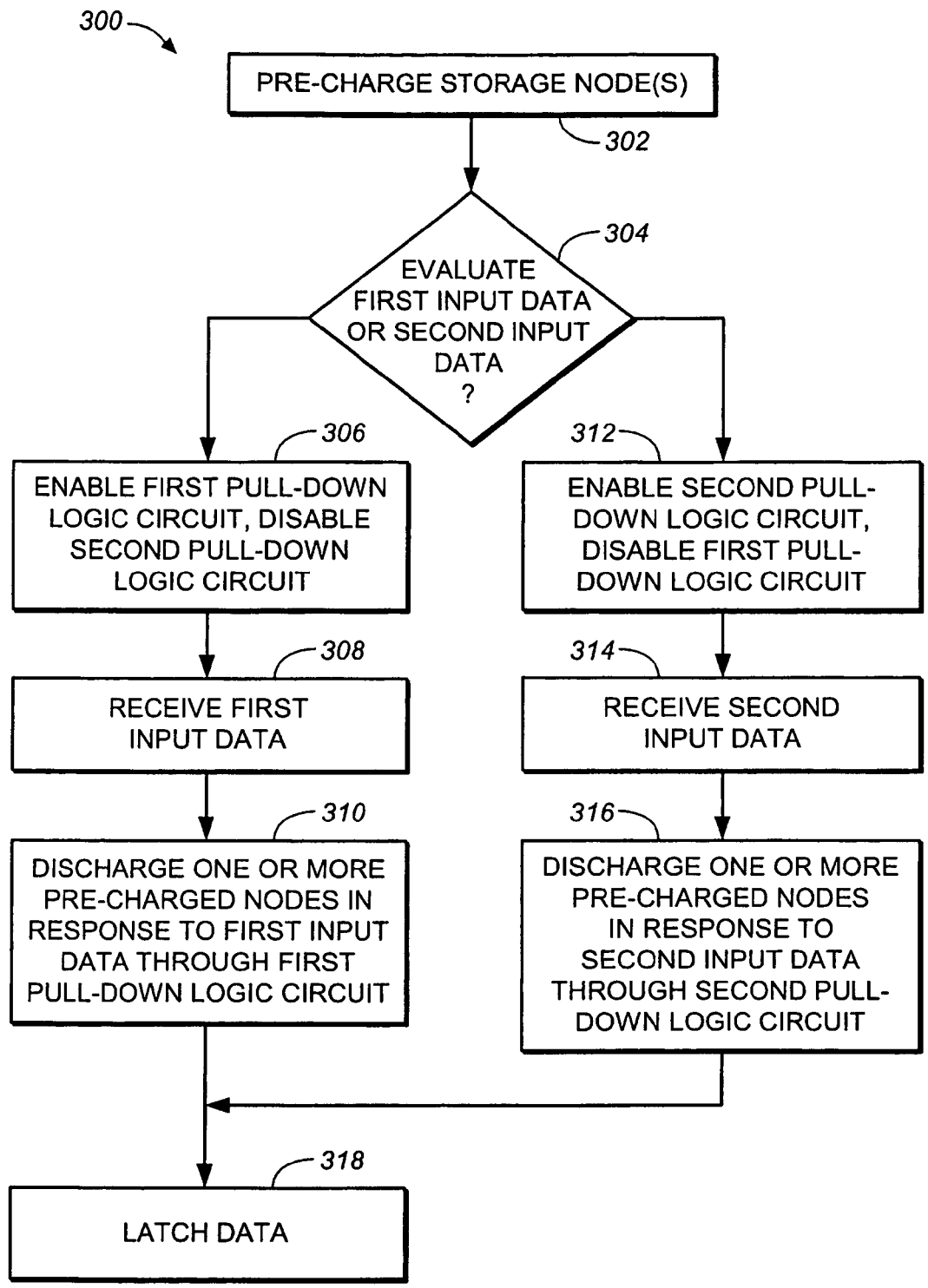
FIG._3

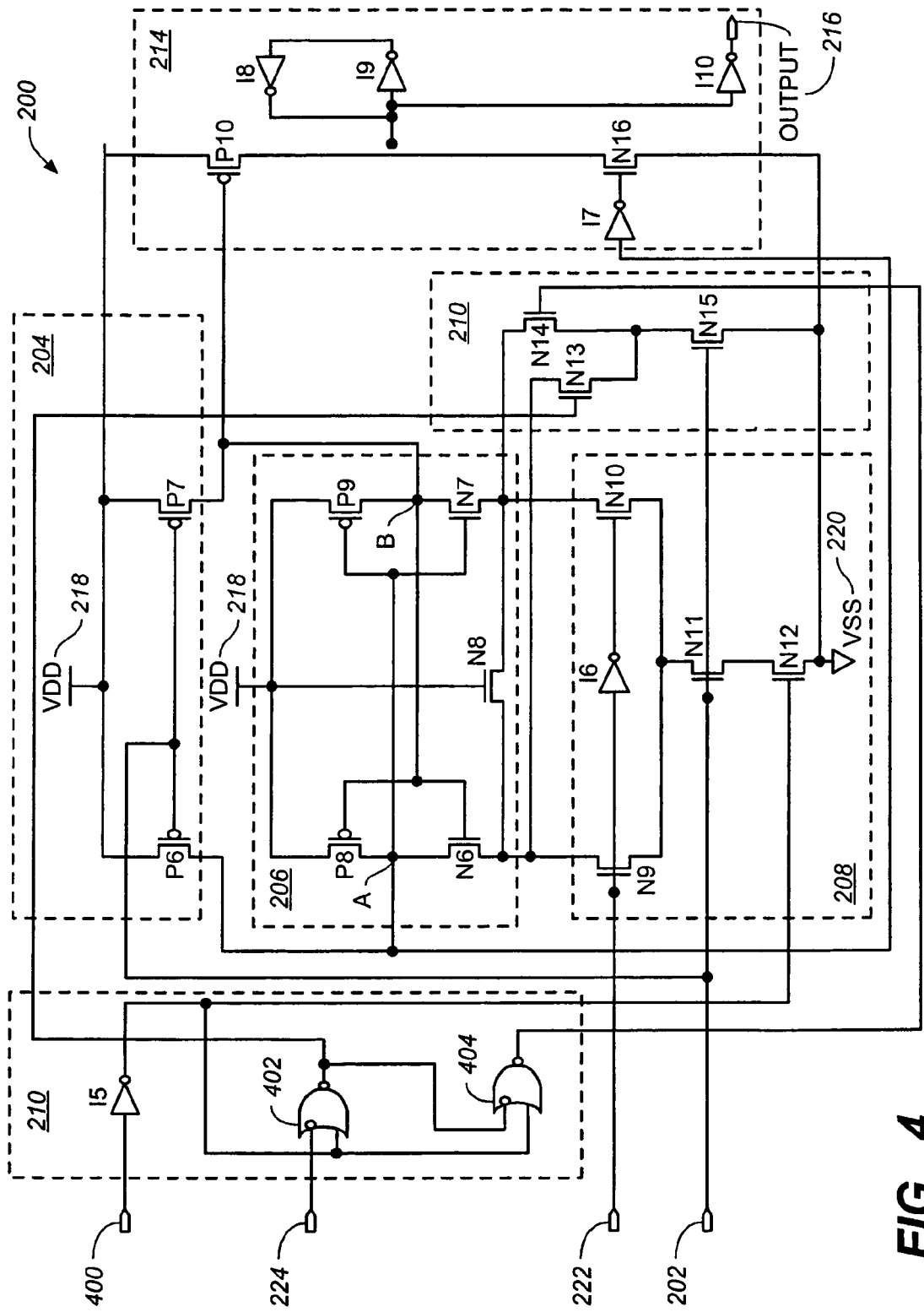
FIG._4

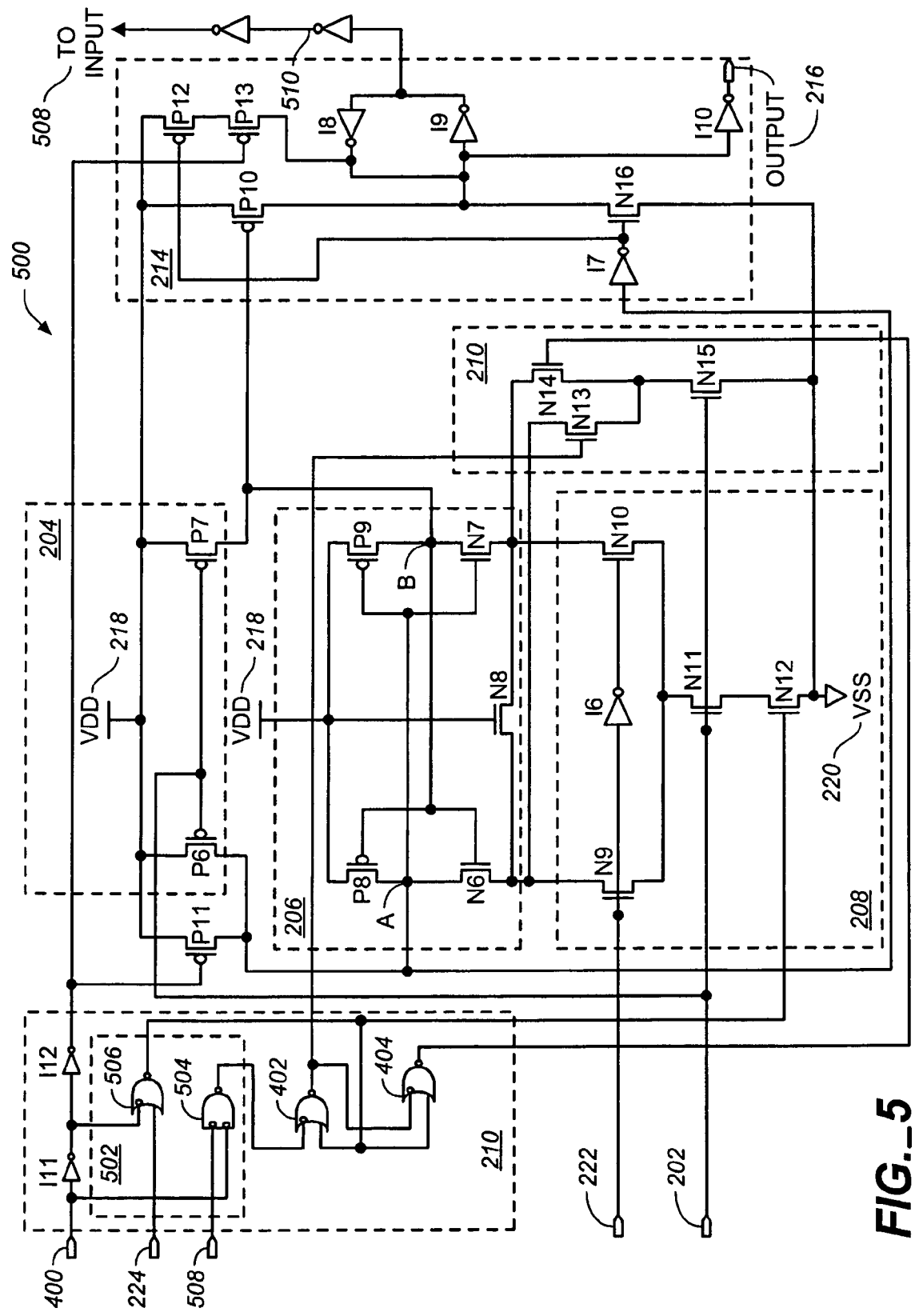
FIG._5

EDGE-TRIGGERED FLIP-FLOP

CROSS-REFERENCE TO RELATED APPLICATIONS

The present application claims priority to commonly assigned U.S. Provisional Patent Application No. 60/533,887, filed on Jan. 2, 2004, which is incorporated herein by reference in its entirety.

BACKGROUND

The following disclosure relates to electrical circuits and signal processing.

A conventional edge-triggered flip-flop is an electronic circuit that can be used as a storage element in logic circuit design. A conventional edge-triggered flip-flop can change state at a positive edge (rising edge) and/or at a negative edge (falling edge) of a clock pulse on a control input of the edge-triggered flip-flop.

Types of edge-triggered flip-flops include, for example, S-R flip-flops, J-K flip-flops, and D flip-flops. Edge-triggered flip-flops include inputs and outputs. Inputs include signal inputs, a SET input, a RESET input, and a clock input. The signal inputs (e.g., S, R, J, K and D) are generally referred to as synchronous inputs of a flip-flop as the signal inputs affect the state of the flip-flop only on the triggering edge of a clock pulse. The SET and RESET inputs are generally referred to as asynchronous inputs as the SET and RESET inputs can affect the state of a flip-flop independent of a clock pulse.

Desirable attributes for an edge-triggered flip-flop include a short setup time, a short clock-to-output delay, and a low capacitance for input signals and the clock signal. Setup time is the time required for input data to be stable before the triggering edge of a clock pulse. Clock-to-output delay is the time required for output data of a flip-flop to be valid after the triggering edge of a clock pulse.

Conventional sense-amp based edge-triggered flip-flops generally have a shorter setup time and a lower input capacitance than conventional master-slave edge-triggered flip-flops in a CMOS (complementary metal-oxide semiconductor) implementation. In addition, the area of a conventional sense-amp based edge-triggered flip-flop is generally comparable to that of a conventional master-slave edge-triggered flip-flop in CMOS implementation.

FIG. 1 shows a conventional sense-amp based, edge-triggered flip-flop, referred to herein as flip-flop 100. Flip-flop 100 includes p-type transistors P1–P5, n-type transistors N1–N5, and inverters I1–I4. Flip-flop 100 further includes transistors T1–T8, that are operable to perform a multiplexing function. Transistors T1–T4 are controlled by input signals S0–S1, and transistors T5–T8 are controlled by input signals D0–D1. Signals S0–S1 are select signals and signals D0–D1 are data input signals. Select signal S0 selects data input signal D0 and select signal S1 selects data input signal D1. In operation, during a pre-charge cycle—i.e., when CLK input 102 is low, complementary storage nodes A and B are pre-charged to VDD. After the pre-charge cycle (when CLK input 102 is high), one of complementary storage nodes A and B is pulled low to VSS according to a selected one of data input signals D0–D1 and value of D0–D1. Flip-flop 100 includes a single sense pull-down path (to VSS) through transistor N4. An output of flip-flop 100 is latched at output 104.

The multiplexing function of transistors T1–T8 can be used to implement a scan chain test. Scan chain testing is a widely used testing scheme for detecting faults of a logic circuit design. Scan chain tests are typically run at low speeds as scan chain tests are primarily used to test stuck-at faults. Transistors T1–T8 can be used to switch input data between operation data (e.g., data input signal D0) and scan data (e.g., data input signal D1), for supporting a scan chain test.

The inclusion of scan chain test functionality (through the multiplexing function of transistors T1–T8), however, degrades the speed performance of flip-flop 100. For example, the setup time of flip-flop 100 increases due to additional delay caused by the 2-to-1 multiplexing function of transistors T1–T8. Furthermore, the input capacitance of flip-flop 100 increases due to the additional transistors required to implement the 2-to-1 multiplexer at the input of flip-flop 100.

Conventional sense-amp based edge-triggered flip-flops typically do not have built-in asynchronous SET/RESET functions, which is another desirable attribute for an edge-triggered flip-flop. Built-in refers to external logic or internal logic implemented with the logic design of a flip-flop. External logic is typically used to implement only synchronous SET/RESET functions in conventional sense-amp based edge-triggered flip-flops.

SUMMARY

In general, in one aspect, this specification describes an edge-triggered flip-flop. The edge-triggered flip-flop includes a storage circuit including one or more storage nodes and a pre-charge circuit in communication with the storage circuit. The storage circuit is configured to pre-charge the one or more storage nodes to a pre-determined voltage potential. The storage circuit further includes a first pull-down logic circuit in communication with the storage circuit and separate second pull-down logic circuit in communication with the storage circuit. The first pull-down logic circuit is configured to discharge one or more of the pre-charged storage nodes in response to first input data and the second pull-down logic circuit is configured to discharge one or more of the pre-charged storage nodes in response to second input data.

Particular implementations can include one or more of the following features. The first pull-down logic circuit can include four transistors. The four transistors of the first pull-down logic circuit can be n-type transistors. The second pull-down logic circuit can include three transistors. The three transistors of the second pull-down logic circuit can be n-type transistors. The edge-triggered flip-flop can further include an enable circuit configured to disable the second pull-down logic circuit while the first pull-down logic circuit is enabled, and disable the first pull-down logic circuit while the second pull-down logic circuit is enabled. The enable circuit can include a first NOR gate and a second NOR gate. The output of the first NOR gate can be an input to the second NOR gate. The second pull-down logic circuit can include a scan chain test circuit configured to receive scan chain test data. The second pull-down logic circuit can include an asynchronous reset circuit configured to asynchronously reset the one or more storage nodes in response to reset data. The asynchronous reset circuit can include a third NOR gate and a first NAND gate.

The edge-triggered flip-flop can further include a latch configured to latch an output value corresponding a logic state of one of the one or more storage nodes. The latch can include two transistors. The two transistors of the latch can be p-type transistors. The edge-triggered flip-flop can be one of an S-R flip-flop, a J-K flip-flop or a D flip-flop. The one or more storage nodes can include two complimentary storage nodes configured to store opposite logic states.

In general, in another aspect, this specification describes an edge-triggered flip-flop that includes a storage circuit means including one or more storage node means and a pre-charge circuit means in communication with the storage circuit means. The storage circuit means is configured to pre-charge the one or more storage node means to a pre-determined voltage potential. The edge-triggered flip-flop further includes a first pull-down logic circuit means in communication with the storage circuit means and a separate second pull-down logic circuit means in communication with the storage circuit means. The first pull-down logic circuit means is configured to discharge one or more of the pre-charged storage node means in response to first input data, and the second pull-down logic circuit means is configured to provide a second path for discharge of one or more of the pre-charged storage node means in response to second input data.

In general, in another aspect, this specification describes a method that includes providing one or more storage nodes in a storage circuit, pre-charging the one or more storage nodes to a pre-determined voltage potential, and discharging one or more of the pre-charged storage nodes through a first pull-down logic circuit in response to first input data or discharging one or more of the pre-charged storage nodes through a separate second pull-down logic circuit in response to second input data.

Particular implementations can include one or more of the following features. The method can further include disabling the second pull-down logic circuit while the first pull-down logic circuit is enabled, and disabling the first pull-down logic circuit while the second pull-down logic circuit is enabled. The method can further include receiving scan chain test data through a scan chain test circuit. The scan chain test circuit can be included within the second pull-down logic circuit. The method can further include asynchronously resetting the one or more storage nodes in response to reset data. The asynchronous reset circuit can be included within the second pull-down logic circuit. The method can further include latching an output value corresponding a logic state of one of the one or more storage nodes. The method can further include storing opposite logic states within the one or more storage nodes.

Implementations can include one or more of the following advantages. An edge-triggered flip-flop is provided that includes two separate sense pull-down paths for sensing separate data inputs. One sense pull-down path can be used to sense operation data, and the second sense pull-down path can be used to sense other data inputs (e.g., scan chain test data, SET/RESET data, and so on). The second sense pull-down path is isolated from the first sense pull-down path—i.e., the second sense pull-down path is disabled while the first sense pull-down path is enabled, and vice-versa. By providing isolation of the first sense pull-down path from the second sense pull-down path, there is no performance degradation with respect to normal operation of the edge-triggered flip-flop, and the flip-flop maintains a short setup time and a short clock-to-output delay (e.g., 30–50 picoseconds). In addition, in one implementation, an edge-triggered flip-flop is provided that includes built-in SET/RESET functions.

The details of one or more implementations are set forth in the accompanying drawings and the description below. Other features and advantages will be apparent from the description and drawings, and from the claims.

DESCRIPTION OF DRAWINGS

FIG. 1 is a schematic diagram of a conventional edge-triggered flip-flop.

FIG. 2 is block diagram of an edge-triggered flip-flop.

FIG. 3 is a flowchart illustrating the operation of the edge-triggered flip-flop of FIG. 2.

FIG. 4 is a schematic diagram an edge-triggered flip-flop including a scan test circuit.

FIG. 5 is a schematic diagram an edge-triggered flip-flop including an asynchronous RESET circuit and a scan test circuit.

Like reference symbols in the various drawings indicate like elements.

DETAILED DESCRIPTION

FIG. 2 is a block diagram of an edge-triggered flip-flop 200. Edge-triggered flip-flop 200 can be any type of edge-triggered flip-flop—e.g., an S-R flip-flop, a J-K flip-flop, a D flip-flop, a T flip-flop, and so on. Edge-triggered flip-flop 200 can be triggered based on a positive and/or negative edge of a clock pulse 202 on a control input of edge-triggered flip-flop 200. In one implementation, edge-triggered flip-flop 200 includes a pre-charge circuit 204, a storage circuit 206, a first pull-down logic circuit 208, a second pull-down logic circuit 210, a pull-down enable circuit 212, and a latch 214.

Pre-charge circuit 204 is in communication with storage circuit 206 and a power supply VDD 218. Pre-charge circuit 204 can include PMOS (p-channel metal-oxide semiconductor) transistors (not shown) and/or NMOS (n-channel metal-oxide semiconductor) transistors (not shown). In one implementation, pre-charge circuit 204 includes PMOS transistors to pre-charge one or more pre-determined storage nodes in storage circuit 206 to a pre-defined voltage during a pre-charge cycle (as discussed in greater detail below). The duration of the pre-charge cycle can be controlled by a pre-charge clock (not shown). A storage node is a connecting point within a logic circuit to which multiple circuit elements (e.g., transistors) can be coupled.

Storage circuit 206 is in communication with first pull-down logic circuit 208, second pull-down logic circuit 210, and latch 214. Latch 214 can store an output value (e.g., output 216) of flip-flop 200. Storage circuit 206 includes one or more pre-determined storage nodes (not shown) operable to store logic states. As discussed above, the one or more pre-determined storage nodes are pre-charged to a pre-defined voltage during a pre-charge cycle.

Each of first pull-down logic circuit 208 and second pull-down logic circuit 210 is in communication with storage circuit 206, a pull-down enable circuit 212, and a power supply VSS 220 (e.g., ground or a low voltage potential). Each of first pull-down logic circuit 208 and second pull-down logic circuit 210 can perform logic functions—e.g., AND/OR/NOR/NAND/XOR—multiplexer functions, latch functions, asynchronous SET/RESET functions, and so on. In one implementation, first pull-down logic circuit 208 receives as an input first data 222, and second pull-down logic circuit 210 receives as an input second data 224. First pull-down logic circuit 208 and second pull-down logic circuit 210 can receive other input signals. First data 222 and second data 224 can be any type of input signal, e.g., operation data, scan chain test data, SET/RESET signals, and so on.

First pull-down logic circuit 208 and second pull-down logic circuit 210 provide two separate sense pull-down paths (to VSS 220) for discharging one or more pre-charged storage nodes in storage circuit 206. In one implementation, second pull-down logic circuit 210 is a slower pull-down path relative to first pull-down logic circuit 208—i.e., second pull-down logic circuit 210 takes a longer time to discharge a pre-charged storage node. Second pull-down logic circuit 210 can include CMOS transistors having a smaller size relative to CMOS transistors in first pull-down logic circuit 208.

One of first data 222 or second data 224 determines the logic states stored in the one or more storage nodes of storage circuit 206 during an evaluation cycle. If first data 222 is being evaluated, pull-down enable circuit 212 enables first pull-down logic circuit 208 and disables second pull-down logic circuit 210. If second data 224 is being evaluated, pull-down enable circuit 212 enables second pull-down logic circuit 210 and disables first pull-down logic circuit 208.

FIG. 3 is a flowchart illustrating the operation of edge-triggered flip-flop 200 (FIG. 2). Referring to FIGS. 2 and 3, pre-charge circuit 204 pre-charges one or more storage nodes in storage circuit 206 (step 302). The storage nodes in storage circuit 206 can be pre-charged to a pre-determined voltage potential (e.g., VDD 218). A determination is made whether first data 222 or second data 224 is to be evaluated (step 304).

If first data 222 is to be evaluated, then pull-down enable circuit 212 enables first pull-down logic circuit 208 and disables second pull-down logic circuit 210 (step 306). First data 222 is received by first pull-down logic circuit 208 (step 308). In one implementation, first data 222 includes operation data—i.e., non-test data—for flip-flop 200. One or more pre-charged storage nodes in storage circuit 206 is discharged through first pull-down logic circuit 208 based on first data 222 (step 310). If second data 224 is to be evaluated, then pull-down enable circuit 212 enables second pull-down logic circuit 210 and disables first pull-down logic circuit 208 (step 312). Second data 224 is received by second pull-down logic circuit 210 (step 314). In one implementation, second data 224 includes test data—e.g., scan chain test data—for testing flip-flop 200. Input signals other than operation data can also be received by second pull-down logic circuit 210. For example, second pull-down logic circuit 210 can receive asynchronous SET/RESET inputs. One or more pre-charged storage nodes in storage circuit 206 is discharged through second pull-down logic circuit 210 based on second data 224 (step 316). A latch 214 can latch an output value corresponding a logic state of one of the one or more storage nodes (step 318).

FIG. 4 shows one implementation of flip flop 200, including pre charge circuit 204, storage circuit 206, first pull down logic circuit 208, second pull down logic circuit 210, and latch 214. In the implementation of FIG. 4, first pull down logic circuit 208 supports operation logic for flip flop 200 and second pull-down logic circuit 210 supports a scan chain test circuit for flip flop 200. Pre charge circuit 204 includes PMOS transistors P6 P7. Storage circuit 206 includes PMOS transistors P8–P9 and NMOS transistors N6–N8. Storage circuit 206 further includes two storage nodes—i.e., node A and node B. Node A is situated between PMOS transistor P8 and NMOS transistor N6. Node B is situated between PMOS transistor P9 and NMOS transistor N7. In one implementation, node A and node B are complimentary storage nodes operable to store opposite logic states. First pull down logic circuit 208 includes NMOS transistors N9–N12, and an inverter I6. First pull down logic circuit 208 receives as input first data 222 through NMOS transistors N9–N10. In one implementation, first data 222 is operation data. Second pull down logic circuit 210 includes NMOS transistors N13–N15, an inverter I5, and NOR gates 402–404. Second pull down logic circuit 210 receives as input second data 224 at NOR gate 402. In one implementation, second data 224 is scan chain test data. Second pull down logic circuit 210 also receives an enable signal 400 that controls NMOS transistor N12 (of first pull down logic circuit 208) and NMOS transistors N13 N14 (of second pull down logic circuit 210).

In operation, when enable signal 400 is low, the outputs of NOR gates 402–404 are low. NMOS transistor N12 is turned on and NMOS transistors N13–N14 are turned off. First pull-down logic circuit 208 is enabled and second pull-down logic circuit 210 is disabled, i.e., the second sense pull down path of flip-flop 200 is disabled by disabling NMOS transistors N13–N14. During the time that the second pull-down logic circuit 210 is disabled and when clock pulse 202 is low (which indicates a pre-charge cycle), NMOS transistor N11 is turned off and nodes A and B are pre-charged (e.g., to VDD 218) through PMOS transistors P6–P7. As nodes A and B are pre-charged, NMOS transistors N6–N7 are turned on.

After the pre-charge cycle—i.e., when clock pulse 202 goes high—PMOS transistors P6–P7 are turned off (pre-charge circuit 204 stops pre-charging nodes A and B) and NMOS transistor N11 is turned on. The logic state of nodes A and B are subsequently determined according to first data 222. For example, if first data 222 is high (or logic state 1), NMOS transistor N9 is turned on and NMOS transistor N10 is turned off. Once NMOS transistor N9 is turned on, the pre-charged voltage at node A is discharged through NMOS transistors N6, N9, N11 and N12 (through first pull-down logic circuit 208). When the voltage potential at node A goes low (or logic state 0), PMOS transistor P9 turns on and NMOS transistor N7 turns off. A high voltage potential, therefore, remains at node B. The low voltage potential at node A is provided to inverter I7 and turns on NMOS transistor N16, and a high voltage potential is output at output 216. Output 216 is high when first data 222 is high. Conversely, output 216 is low when first data 222 is low.

When enable signal 400 is high, NMOS transistor N12 is turned off, and first pull-down logic circuit 208 is shut off, i.e., the first sense pull down path of flip-flop 200 is disabled. When clock pulse 202 is low, NMOS transistor N15 is turned off and nodes A and B are pre-charged (e.g., to VDD 218) through PMOS transistors P6–P7.

After the pre-charge cycle—i.e., when clock pulse 202 goes high, pre-charge circuit 204 stops pre-charging nodes A and B, and NMOS transistor N15 is turned on. The logic state of nodes A and B are subsequently determined according to second data 224. For example, if second data 224 is high, NOR gate 402 outputs a high voltage potential and NOR gate 404 outputs a low voltage potential. Consequently, NMOS transistor N13 is turned on and NMOS transistor N14 is turned off. Once NMOS transistor N13 is turned on, the pre-charged voltage at node A is discharged through NMOS transistors N13 and N15 (of second pull-down logic circuit 210). When the voltage potential at node A goes low (or logic state 0), PMOS transistor P9 turns on and NMOS transistor N7 turns off. A high voltage potential, therefore, remains at node B. As discussed in the example above, the low voltage potential at node A is provided to inverter I7 and turns on NMOS transistor N16, and a high voltage potential is output at output 216. Output 216 is high when second data 224 is high. Conversely, output 216 is low when second data 224 is low.

FIG. 5 shows a flip-flop 500, including pre-charge circuit 204, storage circuit 206, first pull-down logic circuit 208, second pull-down logic circuit 210, and latch 214. Flip-flop 500 operates in a similar manner to flip-flop 200 as discussed above with respect to FIG. 4. However, second pull-down logic circuit 210 (FIG. 5) further includes a built-in asynchronous reset circuit 502 for performing RESET functions. Asynchronous reset circuit 502 includes NAND gate 504 and NOR gate 506. NAND gate 504 receives RESET data 508 as an input. In one implementation, flip-flop 500 further includes PMOS transistors P11–P13. PMOS transistors P11–P13 prevent current drive-by—i.e., a direct current path from VDD 218 to VSS 220 through NMOS transistor N16.

An asynchronous reset operation can occur during the time that clock pulse 202 is high or during the time that clock pulse 202 is low through two different mechanisms.

In one implementation, an asynchronous reset operation occurs during the time that clock pulse 206 is high by forcing a low logic state of "0" into storage circuit 206. Based on RESET data 508 and enable signal 400, NMOS transistor N13 is turned off and NMOS transistor N14 is turned on. Node A is charged to a high voltage potential through PMOS transistor P11. When enable signal 400 goes low, node B is discharged to a low voltage potential through NMOS transistors N14–N15, thus forcing a low logic state of "0" into storage circuit 206. PMOS transistors P12–P13 also turn on and cause a low logic state of "0" at output 216.

In one implementation, an asynchronous reset operation occurs during the time that clock pulse 206 is low by forcing data into latch 214 directly through PMOS transistors P12–P13. Nodes A and B can remain in a pre-charged state during this time.

A number of implementations have been described. Nevertheless, it will be understood that various modifications may be made without departing from the spirit and scope of the invention. For example, edge-triggered flip-flop 500 can further include a feedback enable signal 510, as shown in FIG. 5, to enable edge-triggered flip-flop 500. In one implementation, feedback enable signal 510 is coupled to input 508. In this implementation, input 224 functions as an enable signal. That is, when input 224 is high, the data in latch 214 is maintained through feedback enable signal 510, and when input 224 is low, edge-triggered flip-flop 500 functions normally. In addition, FIG. 5 shows flip-flop 500 including an asynchronous RESET function, however, an asynchronous SET function (not shown) can be implemented in a similar manner. Though two separate sense pull-down paths are described above, any number of separate sense pull-down paths can be provided. Accordingly, other implementations are within the scope of the following claims.

What is claimed is:

1. An edge-triggered flip-flop, comprising:
   a storage circuit including one or more storage nodes;
   a pre-charge circuit in communication with the storage circuit, the storage circuit configured to pre-charge the one or more storage nodes to a pre-determined voltage potential;
   a first pull-down logic circuit in communication with the storage circuit, the first pull-down logic circuit configured to provide a first path for discharge of one or more of the pre-charged storage nodes in response to first input data; and
   a separate second pull-down logic circuit in communication with the storage circuit, the second pull-down logic circuit configured to provide a second path for discharge of one or more of the pre-charged storage nodes in response to second input data.

2. The edge-triggered flip-flop of claim 1, wherein the first pull-down logic circuit comprises four transistors.

3. The edge-triggered flip-flop of claim 2, wherein the four transistors of the first pull-down logic circuit are n-type transistors.

4. The edge-triggered flip-flop of claim 1, wherein the second pull-down logic circuit comprises three transistors.

5. The edge-triggered flip-flop of claim 4, wherein the three transistors of the second pull-down logic circuit are n-type transistors.

6. The edge-triggered flip-flop of claim 1, further comprising:
   an enable circuit configured to disable the second pull-down logic circuit while the first pull-down logic circuit is enabled, and configured to disable the first pull-down logic circuit while the second pull-down logic circuit is enabled.

7. The edge-triggered flip-flop of claim 6, wherein the enable circuit comprises a first NOR gate and a second NOR gate.

8. The edge-triggered flip-flop of claim 7, wherein the output of the first NOR gate is an input to the second NOR gate.

9. The edge-triggered flip-flop of claim 1, wherein the second pull-down logic circuit includes a scan chain test circuit configured to receive scan chain test data.

10. The edge-triggered flip-flop of claim 1, wherein the second pull-down logic circuit includes an asynchronous reset circuit configured to asynchronously reset the one or more storage nodes in response to reset data.

11. The edge-triggered flip-flop of claim 10, wherein the asynchronous reset circuit comprises a third NOR gate and a first NAND gate.

12. The edge-triggered flip-flop of claim 1, further comprising a latch configured to latch an output value corresponding a logic state of one of the one or more storage nodes.

13. The edge-triggered flip-flop of claim 12, wherein the latch comprises two transistors.

14. The edge-triggered flip-flop of claim 13, wherein the two transistors of the latch are p-type transistors.

15. The edge-triggered flip-flop of claim 1, wherein the edge-triggered flip-flop is one of an S-R flip-flop, a J-K flip-flop or a D flip-flop.

16. The edge-triggered flip-flop of claim 1, wherein the one or more storage nodes include two complimentary storage nodes configured to store opposite logic states.

17. The edge-triggered flip-flop of claim 1, wherein the first pull-down logic circuit discharges one or more of the pre-charged storage nodes in response to only the first input data, and the second pull-down logic circuit discharges one or more of the pre-charged storage nodes in response to only the second input data.

18. The edge-triggered flip-flop of claim 1, wherein the first pull-down logic circuit is adapted to be operated independently from the second pull-down logic circuit.

19. The edge-triggered flip-flop of claim 1, wherein each of the first pull-down logic circuit and the second pull-down logic circuit discharges two or more of the pre-charged storage nodes.

20. An edge-triggered flip-flop, comprising:
   a storage circuit means including one or more storage node means;
   a pre-charge circuit means in communication with the storage circuit means, the storage circuit means configured to pre-charge the one or more storage node means to a pre-determined voltage potential;

a first pull-down logic circuit means in communication with the storage circuit means, the first pull-down logic circuit means configured to provide a first path for discharge of one or more of the pre-charged storage node means in response to first input data; and a separate second pull-down logic circuit means in communication with the storage circuit means, the second pull-down logic circuit means configured to provide a second path for discharge of one or more of the pre-charged storage node means in response to second input data.

21. The edge-triggered flip-flop of claim 20, wherein the first pull-down logic circuit means comprises four transistor means.

22. The edge-triggered flip-flop of claim 21, wherein the four transistor means of the first pull-down logic circuit means are n-type transistor means.

23. The edge-triggered flip-flop of claim 20, wherein the second pull-down logic circuit means comprises three transistor means.

24. The edge-triggered flip-flop of claim 23, wherein the three transistor means of the second pull-down logic circuit means are n-type transistor means.

25. The edge-triggered flip-flop of claim 20, further comprising:

enable circuit means configured to disable the second pull-down logic circuit means while the first pull-down logic circuit means is enabled, and configured to disable the first pull-down logic circuit means while the second pull-down logic circuit means is enabled.

26. The edge-triggered flip-flop of claim 25, wherein the enable circuit means comprises a first NOR gate means and a second NOR gate means.

27. The edge-triggered flip-flop of claim 26, wherein the output of the first NOR gate means is an input to the second NOR gate means.

28. The edge-triggered flip-flop of claim 20, wherein the second pull-down logic circuit means includes a scan chain test circuit means configured to receive scan chain test data.

29. The edge-triggered flip-flop of claim 20, wherein the second pull-down logic circuit means includes an asynchronous reset circuit means configured to asynchronously reset the one or more storage node means in response to reset data.

30. The edge-triggered flip-flop of claim 29, wherein the asynchronous reset circuit means comprises a third NOR gate means and a first NAND gate means.

31. The edge-triggered flip-flop of claim 20, further comprising latch means configured to latch an output value corresponding a logic state of one of the one or more storage node means.

32. The edge-triggered flip-flop of claim 31, wherein the latch means comprises two transistor means.

33. The edge-triggered flip-flop of claim 32, wherein the two transistor means of the latch means are p-type transistor means.

34. The edge-triggered flip-flop of claim 20, wherein the edge-triggered flip-flop is one of an S-R flip-flop means, a J-K flip-flop means or a D flip-flop means.

35. The edge-triggered flip-flop of claim 20, wherein the one or more storage node means include two complimentary storage node means configured to store opposite logic states.

36. The edge-triggered flip-flop of claim 20, wherein the first pull-down logic circuit means discharges one or more of the pre-charged storage node means in response to only the first input data, and the second pull-down logic circuit means discharges one or more of the pre-charged storage node means in response to only the second input data.

37. The edge-triggered flip-flop of claim 20, wherein the first pull-down logic circuit means is adapted to be operated independently from the second pull-down logic circuit means.

38. The edge-triggered flip-flop of claim 20, wherein each of the first pull-down logic circuit means and the second pull-down logic circuit means discharges two or more of the pre-charged storage node means.

39. A method, comprising:

providing one or more storage nodes in a storage circuit;

pre-charging the one or more storage nodes to a pre-determined voltage potential; and discharging one or more of the pre-charged storage nodes through a first pull-down logic circuit in response to first input data or discharging one or more of the pre-charged storage nodes through a separate second pull-down logic circuit providing a first path, providing a second path, in response to second input data.

40. The method of claim 39, further comprising:

disabling the second pull-down logic circuit while the first pull-down logic circuit is enabled, and disabling the first pull-down logic circuit while the second pull-down logic circuit is enabled.

41. The method of claim 39, further comprising receiving scan chain test data through a scan chain test circuit within the second pull-down logic circuit.

42. The method of claim 39, further comprising asynchronously resetting the one or more storage nodes in response to reset data.

43. The method of claim 39, further comprising latching an output value corresponding a logic state of one of the one or more storage nodes.

44. The method of claim 39, further comprising storing opposite logic states within the one or more storage nodes.

45. The method of claim 39, further comprising discharging one or more of the precharged storage nodes using the first pull-down logic circuit in response to only the first input data, and discharging one or more of the pre-charged storage nodes using the second pull-down logic circuit in response to only the second input data.

46. The method of claim 39, further comprising adapting the first pull-down logic circuit to be operated independently from the second pull-down logic circuit.

47. The method of claim 39, wherein discharging one or more of the pre-charged storage nodes includes discharging two or more of the pre-charged storage nodes using the first pull-down logic circuit and discharging two or more of the pre-charged storage nodes using the second pull-down logic circuit.

* * * * *